United States Patent
Nasuno et al.

(10) Patent No.: US 8,962,983 B2
(45) Date of Patent: Feb. 24, 2015

(54) LAMINATED BODY HAVING SEMICONDUCTOR LAYER AND LAYER THICKNESS MEASUREMENT PORTION, AND THIN-FILM PHOTOELECTRIC CONVERSION DEVICE AND INTEGRATED THIN-FILM SOLAR CELL HAVING THE SAME

(75) Inventors: Yoshiyuki Nasuno, Osaka (JP); Tohru Takeda, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 648 days.

(21) Appl. No.: 13/203,883

(22) PCT Filed: Mar. 1, 2010

(86) PCT No.: PCT/JP2010/053248
§ 371 (c)(1),
(2), (4) Date: Aug. 30, 2011

(87) PCT Pub. No.: WO2010/101116
PCT Pub. Date: Sep. 10, 2010

(65) Prior Publication Data
US 2012/0042934 A1    Feb. 23, 2012

(30) Foreign Application Priority Data
Mar. 3, 2009    (JP) .................... 2009-049214

(51) Int. Cl.
*H01L 31/00*    (2006.01)
*H01L 31/0236*    (2006.01)
(Continued)

(52) U.S. Cl.
CPC ...... *H01L 31/02366* (2013.01); *H01L 31/0236* (2013.01); *H01L 31/02363* (2013.01); *H01L 22/12* (2013.01); *H01L 27/1423* (2013.01); *Y02E 10/50* (2013.01)
USPC .......................................... 136/256

(58) Field of Classification Search
CPC .................. H01L 31/0236; H01L 31/02363; H01L 31/02366; H01L 22/12
USPC .......................................... 136/256
See application file for complete search history.

(56) References Cited

U.S. PATENT DOCUMENTS 5,358,574 A * 10/1994 Sopori ............................. 438/71
5,668,050 A *  9/1997 Iwasaki ........................... 438/69
(Continued)

FOREIGN PATENT DOCUMENTS

| JP | 6-204537 | 7/1994 |
| JP | 09-243332 | 9/1997 |

(Continued)

OTHER PUBLICATIONS

International Search Report for PCT/JP2010/053248 mailed May 25, 2010.

*Primary Examiner* — Allison Bourke
(74) *Attorney, Agent, or Firm* — Nixon & Vanderhye P.C.

(57) ABSTRACT

A laminated body, comprising:
a supporting body having a concave-convex surface; and
a semiconductor layer laminated on a surface of the supporting body, wherein
a part of the supporting body includes a layer thickness measurement portion for optically measuring a layer thickness of the semiconductor layer, and
the layer thickness measurement portion includes a reduced surface roughness region whose surface roughness is smaller than that of the concave-convex surface.

12 Claims, 11 Drawing Sheets

(51) Int. Cl.
*H01L 21/66* (2006.01)
*H01L 27/142* (2014.01)

(56) References Cited

U.S. PATENT DOCUMENTS

| | | | |
|---|---|---|---|
| 6,313,397 B1 * | 11/2001 | Washio et al. | 136/256 |
| 2008/0196761 A1 * | 8/2008 | Nakano et al. | 136/258 |
| 2009/0308450 A1 * | 12/2009 | Adibi et al. | 136/256 |
| 2010/0059847 A1 * | 3/2010 | Nasuno et al. | 257/458 |

FOREIGN PATENT DOCUMENTS

| | | | | |
|---|---|---|---|---|
| JP | 2007-285810 | | 11/2007 | |
| WO | WO 2005053037 A1 | * | 6/2005 | ......... H01L 31/0236 |
| WO | WO2008/090666 | * | 7/2008 | |
| WO | WO 2008/114471 | | 9/2008 | |

\* cited by examiner

LAMINATED BODY HAVING SEMICONDUCTOR LAYER AND LAYER THICKNESS MEASUREMENT PORTION, AND THIN-FILM PHOTOELECTRIC CONVERSION DEVICE AND INTEGRATED THIN-FILM SOLAR CELL HAVING THE SAME

This application is the U.S. national phase of International Application No. PCT/JP2010/053248 filed 1 Mar. 2010 which designated the U.S. and claims priority to JP 2009-049214 filed 3 Mar. 2009, the entire contents of each of which are hereby incorporated by reference.

TECHNICAL FIELD

The present invention relates to a laminated body having a semiconductor layer and a layer thickness measurement portion formed on a supporting body having a concave-convex surface, as well as to a thin-film photoelectric conversion device and an integrated thin-film solar cell having the same.

BACKGROUND ART

In the field of electronics such as liquid crystal display devices as well as semiconductor such as LSI, it is important to form a thin film with a high degree of accuracy, and therefore it is required to measure thickness of a thin film with a high degree of accuracy.

Patent Document 1, for example, proposes a film thickness measurement device capable of measuring a thickness of a transparent or translucent thin film formed on a substrate by illuminating measurement light to a transparent glass substrate for producing a liquid crystal display device, and by alternately transmitting the measurement light and receiving reflected light of the measurement light from the substrate between a measuring unit main body and a sensor unit via an optical fiber, as well as a film thickness measurement method.

PRIOR ART DOCUMENTS

Patent Document

Patent Document 1: Japanese Patent Laid-open Publication No. H09-243332

SUMMARY OF THE INVENTION

Problems to be Solved by the Invention

However, as shown in FIG. 7 of Patent Document 1, this film thickness measurement method presupposes the measurement of a thickness of a thin film formed on a surface of a flat substrate. Therefore, there is a problem that, if a supporting body as a base of a thin film whose thickness is to be measured includes concavity and convexity, accuracy in the film thickness measurement decreases due to the concave-convex surface.

Examples of a laminated body having a thin film formed on a supporting body whose surface is concave-convex include a thin-film solar cell having a semiconductor layer and an opposite electrode layer formed on a conductive layer on a substrate. In a thin-film solar cell, concavity and convexity are formed, in order to efficiently utilize light, on a surface of the conductive layer that is brought into contact with the semiconductor layer.

As a film thickness of the semiconductor layer is critical for output characteristics of the thin-film solar cell, it is necessary in mass production to accurately control the film thickness of the semiconductor layer to be a predetermined film thickness. However, as the conductive layer includes concavity and convexity on its surface as described above, it is not possible to inspect the semiconductor layer using an optical film thickness measurement device with a high degree of accuracy.

Therefore, generally when measuring the film thickness of the semiconductor layer of the thin-film solar cell, a through hole that reaches the conductive layer is formed in a part of the semiconductor layer, and the film thickness of the semiconductor layer is measured in a portion of the through hole using a stylus profilometer. However, according to this film thickness measurement method, a probe of the stylus profilometer possibly makes a physical contact with a thin semiconductor layer (500 nm, for example) to peel the semiconductor layer, and therefore it is not a desirable film thickness measurement method.

The present invention is made in view of such a problem, and a major object of the present invention is to provide a laminated body for which a film thickness of a semiconductor layer formed on a supporting body having a concave-convex surface can be measured with a high degree of accuracy, and a method of manufacturing such a laminated body.

Means for Solving the Problems

Thus, according to the present invention, there is provided a laminated body including: a supporting body having a concave-convex surface; and a semiconductor layer layered on a surface of the supporting body, wherein the supporting body includes a layer thickness measurement portion for optically measuring a layer thickness of the semiconductor layer, the layer thickness measurement portion being included as a part of the supporting body, and the layer thickness measurement portion includes a reduced surface roughness region whose surface roughness is smaller than that of the concave-convex surface.

Effects of the Invention

The laminated body according to the present invention includes the layer thickness measurement portion for measuring the layer thickness of the semiconductor layer, and the layer thickness measurement portion includes the reduced surface roughness region whose surface roughness is smaller than that of the concave-convex surface. Therefore, it is possible to measure the layer thickness of the semiconductor layer with a high degree of accuracy.

MODES FOR CARRYING OUT THE INVENTION (Embodiment 1: Description of Structure)

Figure 1:
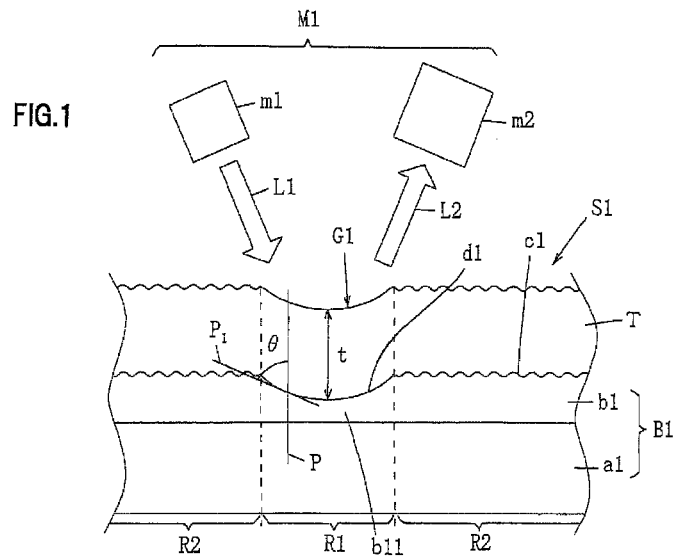
FIG. 1 shows a partial cross-sectional view of a laminated body for illustration of an idea of a film thickness measurement method for a semiconductor layer of an Embodiment 1 according to the present invention.

FIG. 1 shows a partial cross-sectional view of a laminated body for illustration of an idea of a film thickness measurement method for a semiconductor layer of an Embodiment 1 according to the present invention.

A laminated body S1 includes a supporting body B1 having a concave-convex surface c1, a semiconductor layer T formed on the concave-convex surface c1 of the supporting body B1, and a layer thickness measurement portion G1 configured to allow a thickness of the semiconductor layer T to be optically measured.

The layer thickness measurement portion G1 is provided at a region R1 that is a part of the laminated body S1, and a layer thickness t of the semiconductor layer T is measured at this portion.

To be more specific, the supporting body B1 includes a substrate a1 and a base layer b1 laminated on the substrate a1, and the base layer b1 has the concave-convex surface c1.

Further, in the region R1, the base layer b1 is provided with a reduced surface roughness region d1 whose surface roughness is smaller than a surface roughness of the concave-convex surface c1.

Referring to FIG. 1, a reference symbol R2 represents a region in which the concave-convex surface c1 is formed in the laminated body S1.

Hereinafter, the "region R1" is often referred to as a "layer thickness measurement portion forming region" or a "layer thickness measurement region", and the "region R2" is often referred to as a "layer thickness non-measurement region".

The reduced surface roughness region d1 of the base layer b1 is configured in a concave shape having a gradual concave curve surface. When a vertical interval of concavity and convexity of the concave-convex surface c1 is on the order of 100-1000 nm, a depth of the reduced surface roughness region d1 is on the order of 7-900 nm.

Here, the concave-convex surface c1 refers to a concave-convex surface whose surface roughness is not smaller than 10 nm in RMS value, and not a concave-convex surface at the atomic level.

In the case of the Embodiment 1, a thin-film section b11 of the base layer b1 is provided under a bottom of the reduced surface roughness region d1 in the concave shape, and the substrate a1 is not exposed. Leaving the thin-film section b11 maintains contact between the semiconductor layer T and the base layer b1.

It is preferable that the concave shape of the reduced surface roughness region d1 is such that an angle $\theta$ of a tangent line $P_1$ tangent to the concave curve surface with respect to a normal line (vertical line) P presupposing the supporting body B1 is a flat surface is not smaller than 45 degrees.

If the angle $\theta$ is smaller than 45 degrees, the reduced surface roughness region d1 depresses steeply, that is, an internal surface from an opening edge to the bottom of the reduced surface roughness region d1 becomes almost parallel to the normal line P. Therefore, when the semiconductor layer T is provided by growing crystals on the base layer b1, it is highly probably that the semiconductor layer T cracks between the internal surface and the bottom and between the internal surface and the concave-convex surface c1.

Figure 7A:
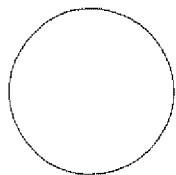
FIGS. 7(A)-7(C) show diagrams each illustrating a planar shape of a reduced surface roughness region according to the Embodiments 1-6.
Figure 7B:
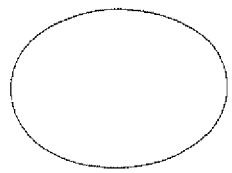
Figure 7C:
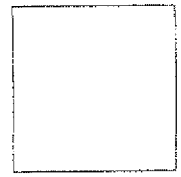

Further, a planar shape of the reduced surface roughness region d1 is a closed figure having an endless outline. Examples of the closed figure include a circle shown in FIG. 7(A), an ellipse shown in FIG. 7(B), and a square shown in FIG. 7(C), and the circle is preferable. Moreover, it is sufficient that the planar shape of the reduced surface roughness region d1 is greater than a diameter of measurement light by an optical film thickness measurement that will be later described, for example, within a size of 5 mm square.

The reduced surface roughness region d1 in a closed figure as described above can be formed by a known Galvano scanning laser. It should be noted that while the reduced surface roughness region d1 in a groove (open figure) can be formed on the base layer b1 by a line processing laser, this is not desirable as an area for providing the groove increases more than necessary.

The semiconductor layer T is a layer whose layer thickness can be measured using an optical film thickness measurement method by receiving reflected light L2 that has been obtained by measurement light L1 emitted to and reflected on the layer thickness measurement portion G1, for example, ellipsometry (ellipsometric method) which is a film thickness measurement method using polarization properties of the light.

It should be noted that FIG. 1 shows a schematic structure of a common ellipsometer M1 including a light source unit m1 configured to emit the measurement light L1 and a light receiving unit m2 configured to receive the reflected light L2. In general, a beam diameter of the measurement light in the ellipsometry is on the order of 1 mm$\phi$.

Further, the semiconductor layer T is provided with a concave section having the same shape as that of the reduced surface roughness region d1 by reflecting the shape thereof at a position of the reduced surface roughness region d1 in the base layer b1, and is provided with a concave-convex surface reflecting the shape of the concave-convex surface c1 in the region R2 at the concave-convex surface c1 of the base layer b1.

Examples of the semiconductor layer T include, but not limited to, a semiconductor layer made of silicon-based semiconductor, CIS ($CuInSe_2$) compound semiconductor, CIGS ($Cu(In,Ga)Se_2$) compound semiconductor, CdTe-based compound semiconductor, ITO, ZnO, and the like. Specific examples of a case in which the semiconductor layer T is made of silicon-based semiconductor, CIS ($CuInSe_2$) compound semiconductor, CIGS ($Cu(In,Ga)Se_2$) compound semiconductor, and CdTe-based compound semiconductor include a photoelectric conversion layer having a p-n junction or a p-i-n junction.

In the case of the Embodiment 1, a surface roughness of the reduced surface roughness region d1 is reduced to be smaller than a surface roughness of the concave-convex surface c1 so as to allow the measurement of the layer thickness of the semiconductor layer T by the ellipsometry with accuracy of an error lower than 5%. At this time, according to the present invention, the surface roughness is evaluated by a value of RMS (Root-Mean-Square-Roughness: root mean square). If the error in the measurement accuracy by the ellipsometry is 5% or higher, it is difficult to manufacture high quality devices as performance of the devices is largely affected by the film thickness of the semiconductor layer T.

In the following description, an evaluation result for a photoelectric conversion layer where the substrate a1 is a glass whose thickness is 4 mm, the base layer b1 is a transparent conductive layer ($SnO_2$), and the semiconductor layer T is made of silicon-based thin film semiconductor is shown as one example.

As evaluation targets, eight laminated bodies (samples) to be evaluated were manufactured by forming the base layer b1 of a set film thickness of 200 nm having the layer thickness non-measurement region R2 whose RMS value is 25.4 nm on each of eight pieces of the substrate a1, forming the reduced surface roughness regions d1 of different RMS values on the respective base layers b1, and then, forming the semiconductor layer T of a set film thickness of 300 nm on each of the base layers b1. The RMS values of the reduced surface roughness regions d1 of the respective samples are 9.8 nm, 16.8 nm, 19.2 nm, 21.1 nm, 23.0 nm, 23.8 nm, 24.8 nm, and 25.4 nm.

Further, for evaluating the samples, a reference laminated body in which a semiconductor layer of a set film thickness of 300 nm was formed on a glass substrate whose thickness is 4 mm and RMS value of a surface roughness is 1.8 nm without a base layer was manufactured. In this reference laminated body, a base surface under the semiconductor layer is a surface of the glass substrate that is flat as compared to the base layer, an error when measuring the film thickness of the semiconductor layer by the ellipsometry becomes smaller than when measuring the samples, and whereby it is possible to evaluate a value of a measured film thickness of the semiconductor layer T of each sample.

The film thickness of the semiconductor layer of the reference laminated body and a film thickness of each sample at the reduced surface roughness region d1 of the semiconductor layer were measured by an ellipsometry and a profilometer.

At this time, the VB-200 model available from WOOLLAM was used as the ellipsometer, and the ET4000A model available from Kosaka Laboratory Ltd. was used as the profilometer.

Then, an error (%) between the film thickness t measured using the ellipsometry and the film thickness t measured using the profilometer was found, and a result is shown in Table 1.

It should be noted that, in Table 1 and Table 2 that will be later described, "RMS Value (nm) of Base Layer Surface of Semiconductor Layer" refers to an RMS value of the surface of the glass substrate in the case of the reference laminated body, and an RMS value of the reduced surface roughness region d1 of the base layer b1 in the case of each sample.

In the film thickness measurement of the semiconductor layers of the reference laminated body and the samples, first, the measurement was performed by the ellipsometry, and then, a groove section whose width is 60 μm was formed in each semiconductor layer by laser scribing, and a step in the groove section in each semiconductor layer was measured by the profilometer.

It should be noted that the film thickness value of the semiconductor layer measured by the profilometer is less affected by the concavity and convexity of the base layer surface of the semiconductor layer as compared to that by the ellipsometry, and thus can be used as an evaluation reference of the result of the film thickness by the ellipsometry.

TABLE 1

| RMS value (nm) of base layer surface of semiconductor layer | Film thickness value (nm) of semiconductor layer measured by ellipsometry | Film thickness value (nm) of semiconductor layer measured by profilometer | Error (%) |
|---|---|---|---|
| 1.8 | 327.1 | 332.3 | 1.6 |
| 9.8 | 374.1 | 381.2 | 1.9 |
| 16.8 | 373.0 | 382.5 | 2.5 |
| 19.2 | 394.4 | 385.0 | 2.4 |
| 21.1 | 370.5 | 383.8 | 3.5 |
| 23.0 | 364.8 | 383.8 | 4.9 |
| 23.8 | 356.5 | 383.8 | 7.1 |
| 24.8 | 349.5 | 380.8 | 8.2 |
| 25.4 | 300.3 | 334.7 | 10.3 |

Figure 14:
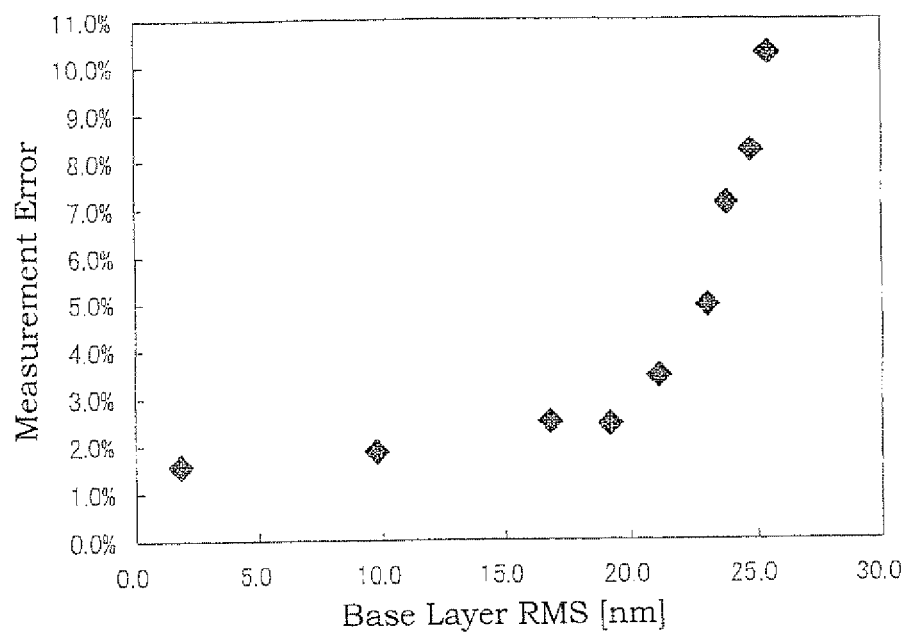
FIG. 14 shows a chart showing a relation between a surface roughness (RMS value) and a measurement error of a concave-convex surface of a base layer in the laminated body of the Embodiment 1.

Further, plotting the errors (%) between the film thickness values measured by the ellipsometry and the film thickness values measured by the profilometer with respect to the RMS values of the base layers b1 of the reduced surface roughness regions d1 shows a chart shown in FIG. 14. A horizontal axis in FIG. 14 represents the RMS values of the reduced surface roughness regions d1 of the base layers b1.

From the result shown in FIG. 14, it is clear that the error in the film thickness measurement becomes smaller by reducing the surface roughness (RMS) of the base layer b1.

Here, by dividing the RMS value of each reduced surface roughness region d1 of the base layers b1 of the respective samples indicated by the horizontal axis in FIG. 14 by an RMS value (25.4 nm) of each layer thickness non-measurement region R2 of the base layers b1 of the respective samples, it is possible to obtain a ratio between the RMS value of the reduced surface roughness region d1 and the RMS value of the layer thickness non-measurement region R2. A relation between the ratios and the measurement errors is shown in Table 2.

TABLE 2

| RMS value (nm) of base layer surface of semiconductor layer | Ratio of RMS values (d1/R2) | Error (%) |
|---|---|---|
| 1.8 | 0.07 | 1.6 |
| 9.8 | 0.38 | 1.9 |
| 16.8 | 0.66 | 2.5 |
| 19.2 | 0.75 | 2.4 |
| 21.1 | 0.83 | 3.5 |
| 23.0 | 0.90 | 4.9 |
| 23.8 | 0.94 | 7.1 |
| 24.8 | 0.97 | 8.2 |
| 25.4 | 1 | 10.3 |

From the above result, it can be seen that it is possible to reduce the measurement error by reducing the ratio between the RMS value of the reduced surface roughness region d1 and the RMS value of the layer thickness non-measurement region R2.

For example, in order to allow the measurement of the layer thickness of the semiconductor layer T by the ellipsometry with accuracy of the error lower than 5%, it is preferable that the reduced surface roughness region d1 is formed such that the ratio between the RMS value of the reduced surface roughness region d1 and the RMS value of the layer thickness non-measurement region R2 is no greater than 0.9.

In this case, when the surface roughness of the concave-convex surface c1 of the supporting body B1 is an RMS value of 25.4 nm, for example, the surface roughness of the reduced surface roughness region d1 is an RMS value smaller than 23 nm.

Further, it is more preferable that the reduced surface roughness region d1 is formed such that the ratio between the RMS value of the reduced surface roughness region d1 and the RMS value of the layer thickness non-measurement region R2 is no greater than 0.8, as it is possible to make the error smaller than 3%. In this case, when the surface roughness of the concave-convex surface c1 of the supporting body B1 is an RMS value of 25.4 nm, for example, the surface roughness of the reduced surface roughness region d1 is an RMS value smaller than 20 nm.

According to the laminated body S1 described above, it can be said that the supporting body B1 is configured by a conductive layer as a base layer having a concave-convex surface formed on an insulated substrate, and the reduced surface roughness region d1 is formed on a part of a surface of the conductive layer. In this case, the reduced surface roughness region d1 can be formed on a portion at which the conductive layer is to be removed.

Further, the present invention provides a thin-film photoelectric conversion device including the laminated body S1 provided with the conductive layer having the concave-convex surface formed on the insulated substrate and the semiconductor layer (photoelectric conversion layer) T formed on the conductive layer, and an opposite electrode formed on the semiconductor layer T, as well as an integrated thin-film solar cell and an integrated thin-film solar cell module. These will be later described in detail.

(Embodiment 1: Description of Method for Manufacturing)

In a method of manufacturing the laminated body S1 according to the Embodiment 1, the semiconductor layer T and the layer thickness measurement portion G1 for which the layer thickness of the semiconductor layer T is optically measured are formed on the supporting body B1 having the concave-convex surface c1.

Specifically, first, the laminated body S1 is manufactured by forming the reduced surface roughness region d1 in which the surface roughness of the supporting body B1 in the region R1 is smaller than surface roughness of the other region R2 at the layer thickness measurement portion forming region R1 in the concave-convex surface c1 of the supporting body B1, then, forming the semiconductor layer T on the concave-convex surface c1 of the supporting body B1. In this case, the supporting body B1 is configured such that the base layer b1 having the concave-convex surface c1 is formed on the substrate a1.

Further, this method for manufacturing may include a step of measuring the layer thickness of the semiconductor layer T by an optical layer thickness measurement method of irradiating the region R1 of the laminated body S1 with the measurement light L1, and receiving the reflected light L2.

In a step of forming the laminated body S1, the reduced surface roughness region d1 is formed in the base layer b1 of the supporting substrate B1 such that the error in the accuracy in the layer thickness measurement of the semiconductor layer T by the ellipsometry is smaller than 5%.

In the following description, a case where a laminated body in which the substrate a1 is a translucent insulated substrate (such as glass or polyimide, far example), the base layer b1 is a transparent conductive layer (a material including ZnO or $SnO_2$, for example), and the semiconductor layer T is a photoelectric conversion layer (such as silicon-based semiconductor, CIS ($CuInSe_2$) compound semiconductor, or CIGS ($Cu(In,Ga)Se_2$) compound semiconductor, for example) is manufactured is described as one example.

It should be noted that a glass substrate having an $SnO_2$ film available from. Asahi Glass Co., Ltd can be used as the supporting body B1, for example, and an $SnO_2$ film has a concave and convex surface whose surface roughness is an RMS value of on the order of 20-100 nm.

In the formation of the reduced surface roughness region d1, the reduced surface roughness region d1 is formed such that the ratio between the RMS value of the reduced surface roughness region d1 and the RMS value of the concave-convex surface c1 is no greater than 0.9.

For example, the reduced surface roughness region d1 is formed such that the RMS value of the layer thickness measurement region R1 is smaller than 23-45 nm when the RMS value of the concave-convex surface c1 of the layer thickness non-measurement region R2 of the base layer b1 is 25-50 nm.

Further, the reduced surface roughness region d1 is formed such that the reduced surface roughness region d1 takes a depressed shape having an inner surface that is slanted toward inside of the depressed shape by no smaller than 45 degrees with respect to the normal line P, and takes a circular shape in a planar view, and such that the thin-film section b11 of the base layer b1 remains at the bottom of the depressed shape.

In this case, for example, by removing the base layer b1 (transparent conductive layer) close to the substrate a1 by an IR laser, it is possible to form the reduced surface roughness region d1 having a concave curve surface.

As a specific example, in a ease in which the reduced surface roughness region d1 is formed by removing a part of the base layer b1 by irradiating the layer thickness non-measurement region R2 having the concave-convex surface c1 whose RMS value is 25.4 nm with a fundamental wave of a $YVO_4$ laser, it is possible to set laser conditions including a power at a processing point of 6 W, a frequency of 20 kHz, a diameter of the processing spot for a single shot of 60 μm.

At this time, on the order of 70% of the base layer b1 is removed in its through-thickness direction, and on the order of 30% of the base layer b1 remains on the substrate a1. Also at this time, by controlling an accumulated irradiation amount of the laser per unit area by superposing the shots, for example, by scanning with varying a ratio of superposed area of adjacent processing points from 0% to 80%, the RMSs in the reduced surface roughness region d1 can be respectively from 9.8 nm to 24.8 nm.

In this case, the superposition of the shots is controlled by scanning speed and a processing pitch. However, the control method of the superposition of the shots is not limited to such a method, and such as the processing spot diameter or the frequency can be changed.

Figure 15:
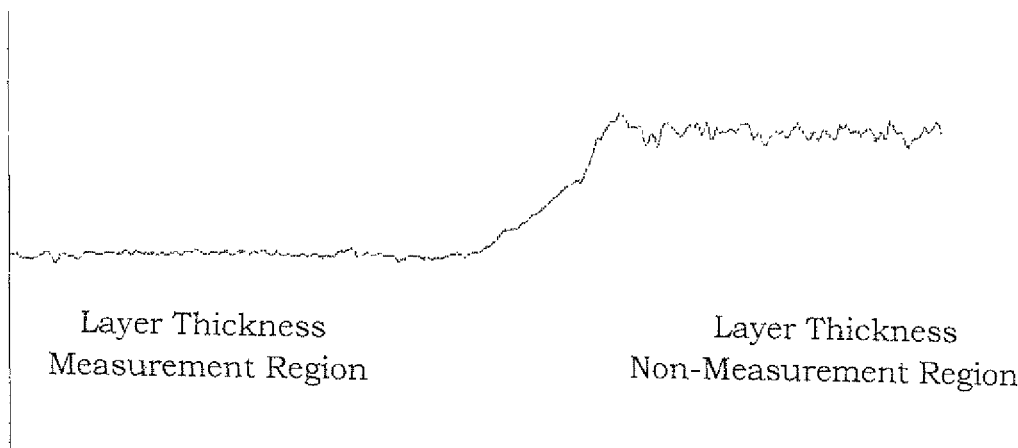
FIG. 15 shows a chart showing a step cross-sectional profile between a reduced surface roughness region and the concave-convex surface of the base layer in the laminated body manufactured according to the method for manufacturing of the Embodiment 1.

FIG. 15 shows a chart showing a step cross-sectional profile between the reduced surface roughness region d1 and the layer thickness measurement region R1 thus manufactured. According to the figure, the concave shape of the reduced surface roughness region d1 is such that the angle θ of the tangent line $P_1$ tangent to the concave curve surface is not smaller than 45 degrees with respect to the normal line P presupposing the supporting body B1 is a flat surface (see FIG. 1).

Next, an example in which a silicon-based semiconductor layer is taken as a typical example as the semiconductor layer T is described.

The "silicon-based semiconductor" refers to amorphous or microcrystalline silicon, or semiconductor in which an impurity such as carbon, germanium, or the like is added to amorphous or microcrystalline silicon (silicon carbide, silicon germanium, or the like). Further, the "microcrystalline silicon" refers to mixed-phase silicon between crystalline silicon whose grain size is small (on the order of several tens to thousand angstrom) and amorphous silicon. The microcrystalline silicon is, for example, formed when a crystalline silicon thin film is manufactured at a low temperature using a non-equilibrium process such as a plasma CVD method.

Examples of the silicon-based semiconductor layer T include a pin-type photoelectric conversion layer including a p-type semiconductor layer, an i-type semiconductor layer, and an n-type semiconductor layer sequentially from a side of the transparent conductive layer. Here, the i-type semiconductor layer can be omitted.

The p-type semiconductor layer is doped with a p-type impurity atom such as boron, aluminum, or the like, and the n-type semiconductor layer is doped with an n-type impurity atom such as phosphorus, or the like. The i-type semiconductor layer may be a semiconductor layer that is completely non-dope, or may be a weak p-type or weak n-type semiconductor layer containing a minute amount of impurity and having a sufficient photoelectric conversion function. As used herein, an "amorphous layer" and a "microcrystalline layer" respectively refer to an amorphous semiconductor layer and a microcrystalline semiconductor layer.

Further, the semiconductor layer (photoelectric conversion layer) T may be a tandem type semiconductor layer in which more than one pin structure is layered, and may be, for example, configured by an upper semiconductor layer including an a-Si:H p-layer, an a-Si:H i-layer, and an a-Si:H n-layer laminated in the stated order on the transparent conductive layer, and a lower semiconductor layer including a μc-Si:H p-layer, a μc-Si:H i-layer, and μc-Si:H n-layer laminated in the stated order on the upper semiconductor layer.

Moreover, the pin structure may be the three-layered semiconductor layer T including an upper semiconductor layer, a middle semiconductor layer, and a lower semiconductor layer, for example, a three-layered structure in which amorphous silicon (a-Si) is used for the upper and the middle semiconductor layer, and microcrystalline silicon (μc-Si) is used for the lower semiconductor layer. The combination of the materials of the semiconductor layer T and a layered structure is not particularly limited.

It should be noted that, according to the embodiment of the present invention, a semiconductor layer on a side of light incidence of the thin-film solar cell is taken as the upper semiconductor layer, and a semiconductor layer on an opposite side of the light incidence is taken as the lower semiconductor layer.

The semiconductor layer T grows evenly both on the concave-convex surface c1 and on the reduced surface roughness region d1 of the base layer b1. At this time, as the reduced surface roughness region d1 is the gradual concave curve surface having the angle θ of not smaller than 45 degrees as described above, no cracks can be produced in the semiconductor layer T due to depression of the reduced surface roughness region d1.

When the layer thickness of the semiconductor layer T is measured by the ellipsometry, the layer thickness measurement region R1 of the semiconductor layer T is irradiated with the measurement light L1 from the light source unit m1 of the ellipsometer M1 at a predetermined incidence angle (50-80 degrees, for example). With this, the measurement light L1 reflects on the surface of the semiconductor layer T and the surface of the reduced surface roughness region d1 of the base layer b1, and the reflected light L2 of the measurement light L1 is received by the light receiving unit m2, and whereby it is possible to measure film thickness t of the semiconductor layer T analytically using a commonly employed method.

At this time, as the surface roughness of the reduced surface roughness region d1 is smoothed to be smaller than that of the concave-convex surface c1, and as the reflected light L2 does not contain a component of the measurement light L1 reflected between a crest and a root of the concave-convex surface c1, it is possible to measure the film thickness t of the semiconductor layer T with a high degree of accuracy.

As described above, after the layer thickness measurement of the semiconductor layer T, a step of forming an opposite electrode layer on the semiconductor layer T of the laminated body S1 is performed, and whereby the thin-film photoelectric conversion device can be manufactured.

Further, using the method of manufacturing the thin-film photoelectric conversion device, it is possible to manufacture an integrated thin-film solar cell in which a plurality of thin-film photoelectric conversion devices are electrically connected in series to each other. This will be described in detail later according to a different embodiment.

(Embodiment 2)

Figure 2:
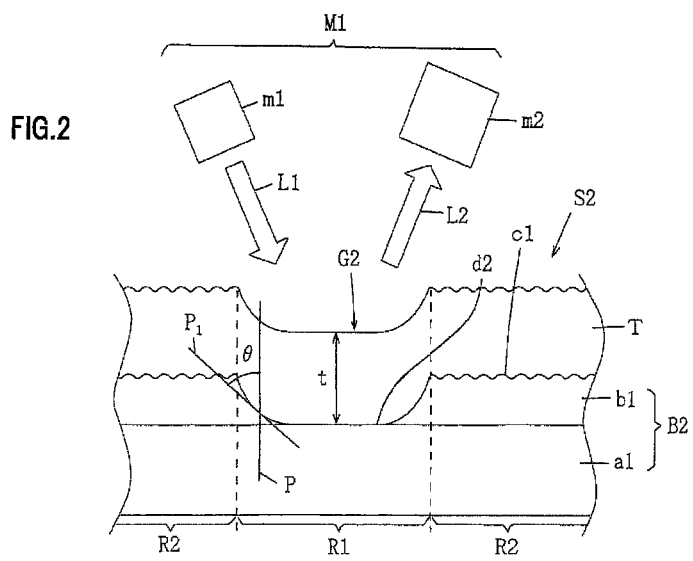
FIG. 2 shows a partial cross-sectional view of a laminated body for illustration of an idea of a film thickness measurement method for a semiconductor layer of an Embodiment 2 according to the present invention.

FIG. 2 shows a partial cross-sectional view of a laminated body for illustration of an idea of a film thickness measurement method for a semiconductor layer of an Embodiment 2 according to the present invention. A laminated body S2 is similar to the Embodiment 1 in that a supporting body B2 is configured by the base layer b1 having the concave-convex surface c1 is laminated on the substrate a1, but a reduced surface roughness region d2 formed on the layer thickness measurement region R1 of the base layer b1 is different from the configuration of the Embodiment 1. In FIG. 2, like components are denoted by the same reference symbols as those used in the Embodiment 1.

In the laminated body S2 according to the Embodiment 2, the reduced surface roughness region d2 is formed in a concave shape such that the substrate a1 is exposed. In this case, the shape and the size of the reduced surface roughness region d2 is similar to that in the Embodiment 1 in that the angle θ of the tangent line $P_1$ tangent to the concave curve surface is not smaller than 45 degrees and that the reduced surface roughness region d2 is a closed figure within a size of 5 mm square, while its depth is deeper than that in the Embodiment 1.

The reduced surface roughness region d2 is formed by first removing the base layer b1 close to the substrate a1 by the IR laser, and then removing the remaining film of the base layer b1 near the surface of the substrate a1 by an SHG laser. The processing by the SHG laser can be performed under the same laser conditions as in the method of the Embodiment 1, other than that the power at the processing point is altered to 15 W.

In this case, an RMS value of the reduced surface roughness region d2 (the exposed surface of the substrate a1) is smaller than 23 nm-45 nm, which is smaller than the RMS value of 25 nm-50 nm of the concave-convex surface c1 of the base layer b1. A ratio between the RMS value of the substrate surface of the reduced surface roughness region d2 and the RMS value of the concave-convex surface c1 of the base layer b1 is within a range no greater than 0.9.

In the Embodiment 2, similarly to the Embodiment 1, the layer thickness t of the semiconductor layer T can be measured using the ellipsometry. At this time, the surface roughness of the substrate a1 of the reduced surface roughness region d2 is smaller than that of the concave-convex surface c1 of the base layer b1. Therefore, the reflected light L2 does not contain a component of the measurement light L1 reflected between the crest and the root of the concave-convex surface c1, and it is possible to measure the film thickness t of the semiconductor layer T with a high degree of accuracy. In addition, as the reflected light L2 is reflected on the smooth flat surface of the substrate a1, the evaluation of the film thickness of the semiconductor layer T becomes easier than the case of the Embodiment 1.

(Embodiment 3)

Figure 3:
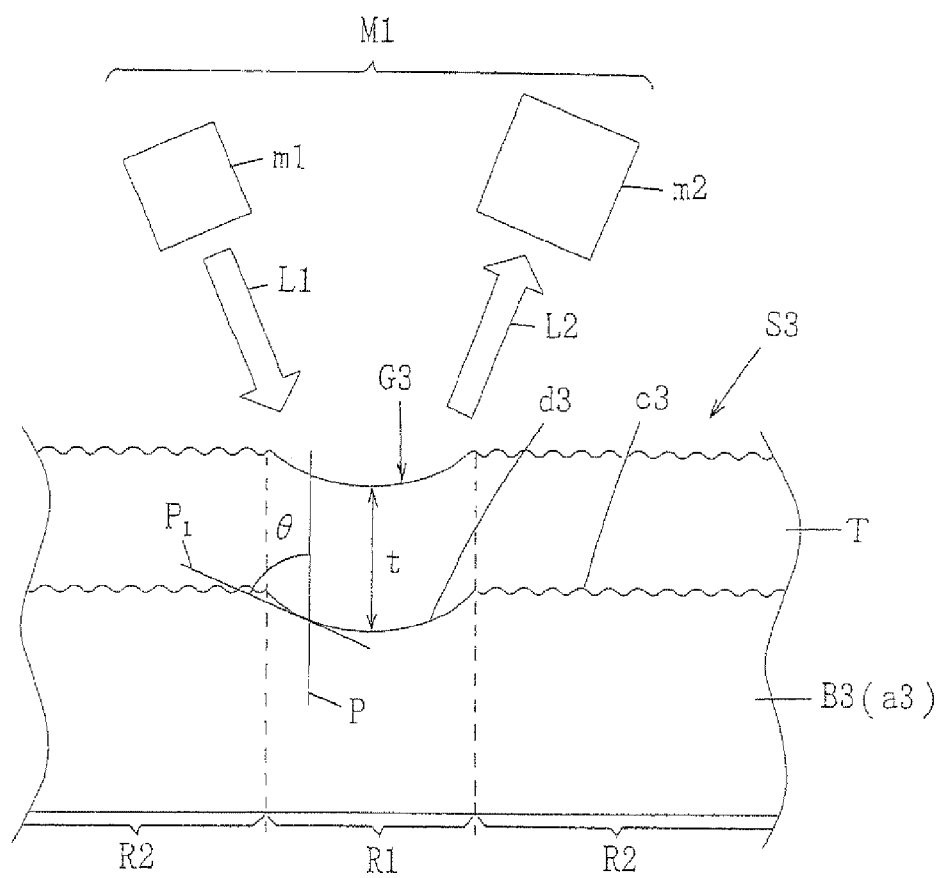
FIG. 3 shows a partial cross-sectional view of a laminated body for illustration of an idea of a film thickness measurement method for a semiconductor layer of an Embodiment 3 according to the present invention.

FIG. 3 shows a partial cross-sectional view of a laminated body for illustration of an idea of a film thickness measurement method for a semiconductor layer of an Embodiment 3 according to the present invention.

A laminated body S3 is different from the laminated body S1 according to Embodiment 1 in that the supporting body B1 is configured as a substrate a3 having a concave-convex surface c3, a reduced surface roughness region d3 in a concave shape is formed on the layer thickness measurement region R1 of the substrate a3, and the semiconductor layer T is laminated on the substrate a3 having the reduced surface roughness region d3. In FIG. 3, like components are denoted by the same reference symbols as those used in the Embodiment 1.

In the laminated body S3 according to the Embodiment 3, examples of the substrate a3 include a single-crystalline or polycrystalline Si substrate having a concave-convex surface, and examples of the semiconductor layer T include a semiconductor layer made of such as silicon-based semiconductor, CIS ($CuInSe_2$) compound semiconductor, CIGS ($Cu(In, Ga)Se_2$) compound semiconductor, CdTe-based compound semiconductor, ITO, or ZnO.

In a case in which the reduced surface roughness region d3 is formed on the substrate a3, it is possible to use a laser or etching capable of removing a part of the substrate a3 to form the reduced surface roughness region d3 having the same surface roughness and the same shape as in the Embodiment 1. For example, when the substrate a3 is made of a single-crystalline Si substrate having a concave-convex surface, the reduced surface roughness region d3 can be formed by performing a polishing process.

In the Embodiment 3, similarly to the Embodiment 1, the layer thickness t of the semiconductor layer T can be measured with a high degree of accuracy using the ellipsometry.

(Embodiment 4)

Figure 4:
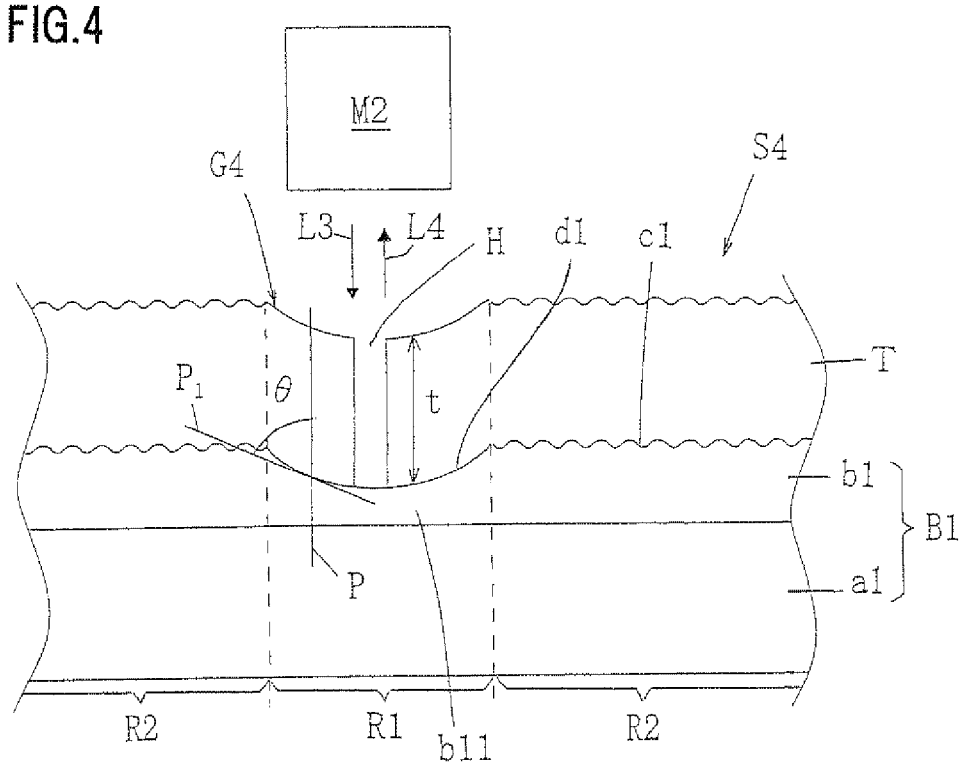
FIG. 4 shows a partial cross-sectional view of a laminated body for illustration of an idea of a film thickness measurement method for a semiconductor layer of an Embodiment 4 according to the present invention.

FIG. 4 shows a partial cross-sectional view of a laminated body for illustration of an idea of a film thickness measurement method for a semiconductor layer of an Embodiment 4 according to the present invention.

A laminated body S4 according to the Embodiment 4 is similar to the Embodiment 1 (FIG. 1) in that the supporting body B1 having the reduced surface roughness region d1 is provided, but different in that a layer thickness measurement portion G4 is provided. In FIG. 4, like components are denoted by the same reference symbols as those used in the Embodiment 1.

The layer thickness measurement portion G4 includes a through hole H that reaches the reduced surface roughness region d1 in the semiconductor layer T on the reduced surface roughness region d1 of the base layer b1. The through hole H is provided in the semiconductor layer T by, for example, illuminating second harmonic of a YVO4 or YAG laser (wavelength: 532 nm) from a side of the substrate a1, and a diameter of the through hole H is on the order of 10-200 μm.

In a case of the laminated body S4, the layer thickness of the semiconductor layer T is measured using a laser microscope M2. As shown in FIG. 4, the film thickness t of the semiconductor layer T of the layer thickness measurement portion G4 can be measured by irradiating an opening edge and a bottom of a stepped section of the through hole H of the semiconductor layer T (the reduced surface roughness region d1) with measurement light L3 from the laser microscope M2, and by receiving reflected light L4 of the measurement light L3.

At this time, the reflected light L4 does not contain a component of the measurement light L3 reflected between the crest and the root of the concave-convex surface c1, it is possible to measure the film thickness t of the semiconductor layer T with a high degree of accuracy. Further, as the film thickness t of the semiconductor layer T is measured contactlessly using the laser microscope M2, the semiconductor layer T may not be brought into contact to be peeled as in the case of the stylus profilometer.

It should be noted that the OLS3000 model available from Olympus Corporation can be used as the laser microscope, for example.

(Embodiment 5)

Figure 5:
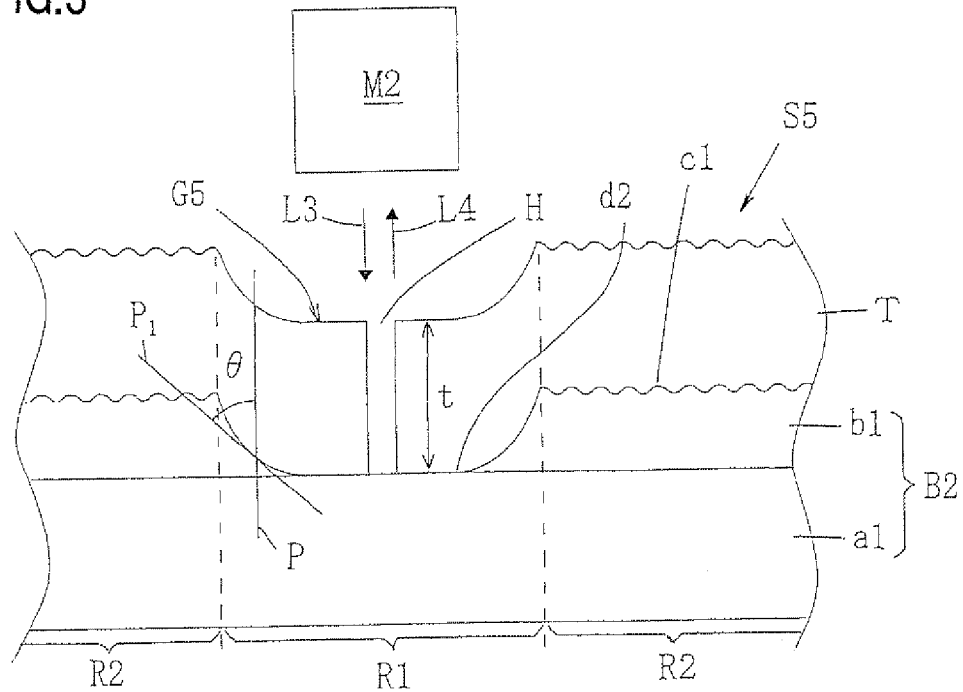
FIG. 5 shows a partial cross-sectional view of a laminated body for illustration of an idea of a film thickness measurement method for a semiconductor layer of an Embodiment 5 according to the present invention.

FIG. 5 shows a partial cross-sectional view of a laminated body for illustration of an idea of a film thickness measurement method for a semiconductor layer of an Embodiment 5 according to the present invention.

A laminated body S5 according to the Embodiment 5 includes the supporting body B2 having the reduced surface roughness region d2 according to the Embodiment 2 (FIG. 2), and a layer thickness measurement portion G5 includes the through hole H in the semiconductor layer T similarly to the Embodiment 4. In FIG. 5, like components are denoted by the same reference symbols as those used in the Embodiments 2 and 4.

In the Embodiment 5, similarly to the Embodiment 4, the layer thickness t of the semiconductor layer T can be measured using a laser microscope. At this time, as the reflected light L2 is reflected on the smooth flat surface of the substrate a1, the evaluation of the film thickness of the semiconductor layer T becomes easier than the case of the Embodiment 4.

(Embodiment 6)

Figure 6:
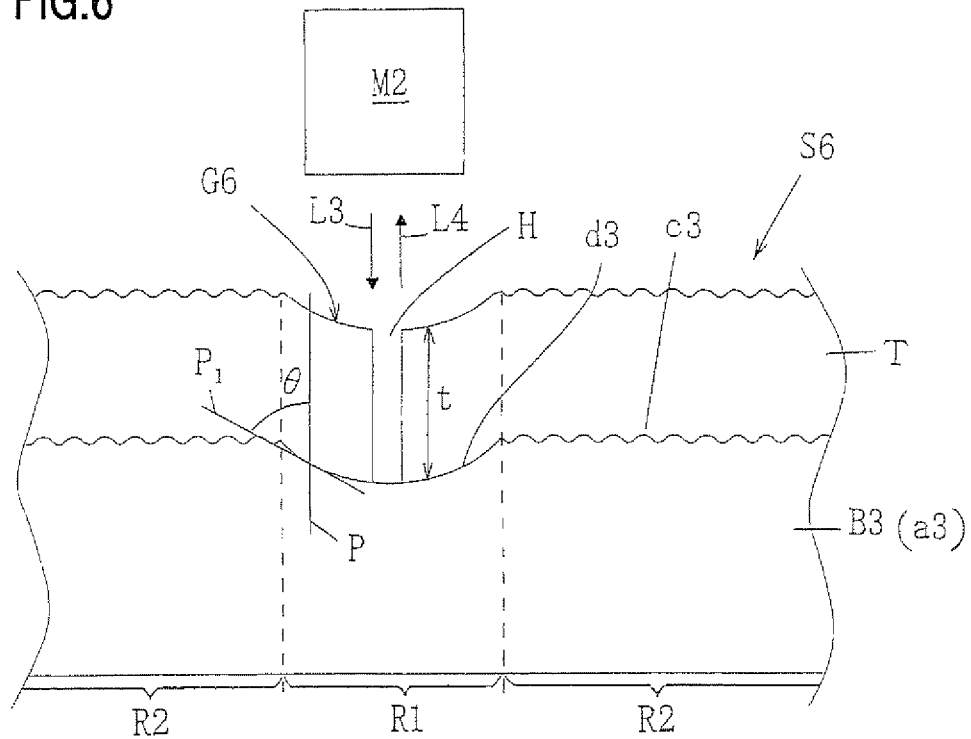
FIG. 6 shows a partial cross-sectional view of a laminated body for illustration of an idea of a film thickness measurement method for a semiconductor layer of an Embodiment 6 according to the present invention.

FIG. 6 shows a partial cross-sectional view of a laminated body for illustration of an idea of a film thickness measurement method for a semiconductor layer of an Embodiment 6 according to the present invention.

A laminated body S6 according to the Embodiment 6 includes a supporting body B3 having the reduced surface roughness region d3 according to the Embodiment 3 (FIG. 3), and a layer thickness measurement portion G6 includes the through hole H in the semiconductor layer T similarly to the Embodiments 4 and 5. In FIG. 6, like components are denoted by the same reference symbols as those used in the Embodiments 3, 4 and 5.

In the Embodiment 6, similarly to the Embodiment 4, the layer thickness t of the semiconductor layer T can be measured with a high degree of accuracy using a laser microscope.

It should be noted that while, according to the Embodiments 1 to 6, the case in which the reduced surface roughness region is formed to have a concave shape having a concave curve surface, the reduced surface roughness region may be formed to have a concave shape having a flat surface whose cross-section is an inverted trapezoid. In this case, the side surface of the concave shape is also gradually sloped by no smaller than 45 degrees with respect to the normal line.

(Embodiment 7)

Figure 8:
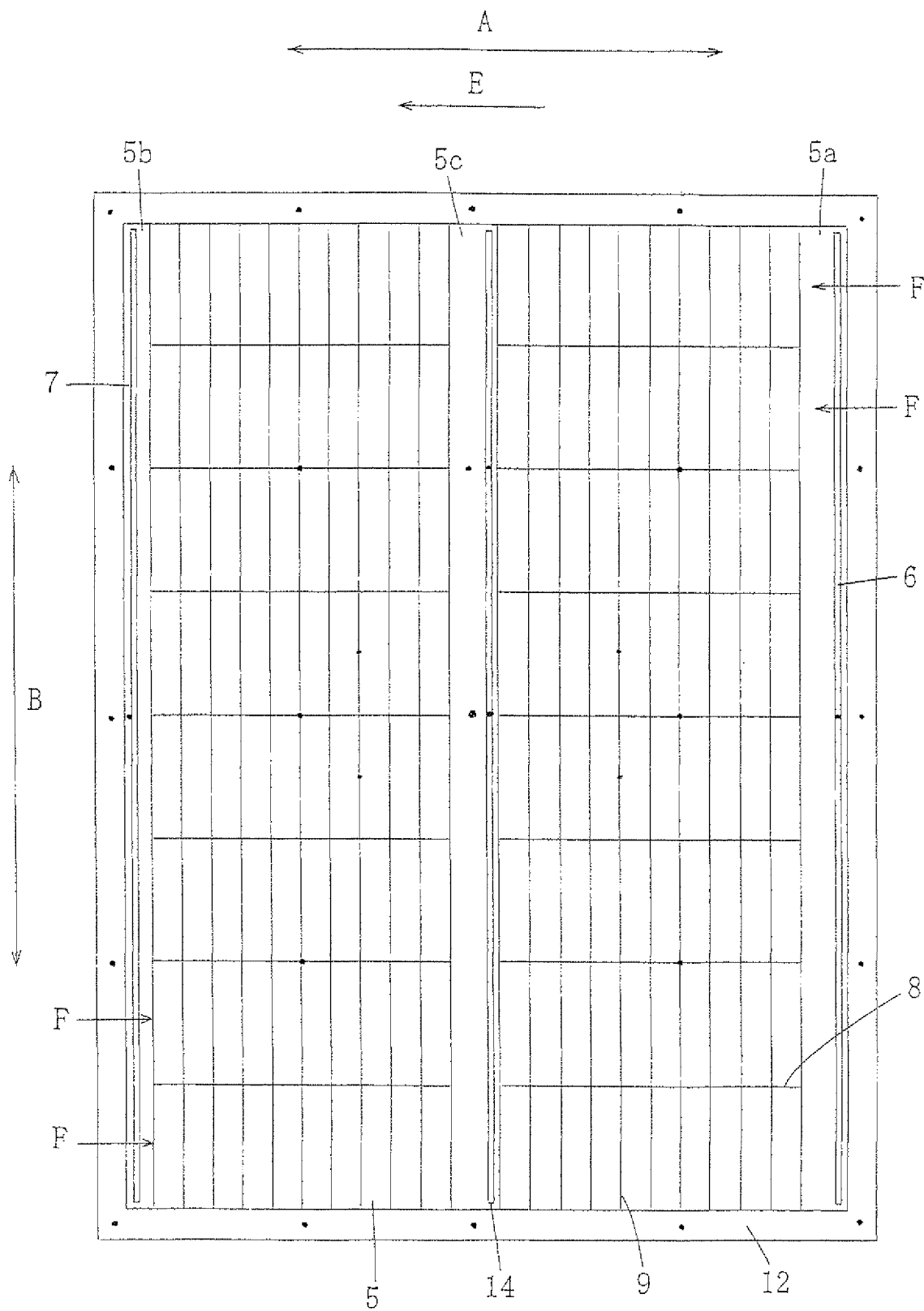
FIG. 8 shows a plan view illustrating an integrated thin-film solar cell module (an Embodiment 7) according to the present invention.

FIG. 8 shows a plan view illustrating an Embodiment 7 (an integrated thin-film solar cell module) according to the present invention.

Figure 9:
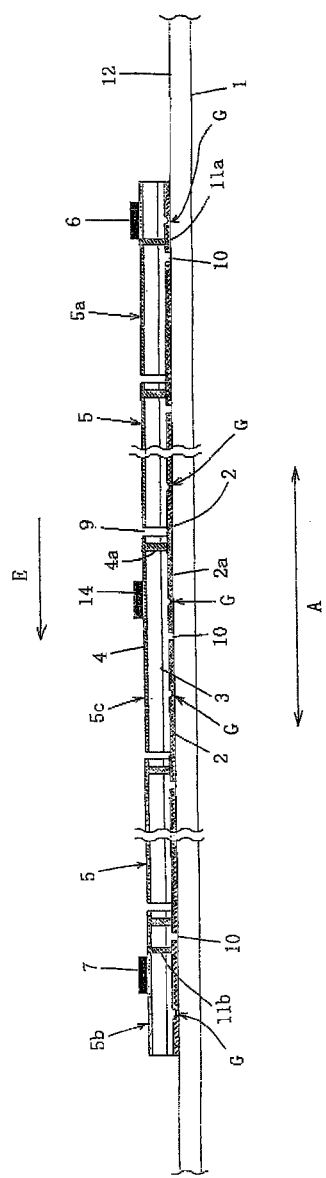
FIG. 9 shows a cross-sectional view of the integrated thin-film solar cell module of the Embodiment 7 taken in a serial connection direction.

The Embodiment 7 describes an integrated thin-film solar cell module including a plurality of integrated thin-film solar cells each having a plurality of thin-film photoelectric conversion devices that are electrically connected in series, each thin-film photoelectric conversion device being configured such that an opposite electrode is formed on a semiconductor layer of the laminated body according to the Embodiment 1 or 2. FIG. 9 shows a cross-sectional view of the integrated thin-film solar cell module taken in a serial connection direction.

The integrated thin-film solar cell module (hereinafter often referred to as the solar cell module) includes an integrated solar cell F having a plurality of thin-film photoelectric conversion devices 5 that are electrically connected in series. Each thin-film photoelectric conversion device 5 is provided with a rectangular and translucent insulated substrate 1, a translucent conductive layer 2, a photoelectric conversion layer 3, and an opposite electrode layer 4 that are sequentially laminated on the insulated substrate 1, and a side of the insulated substrate 1 is a light receiving surface. In this case, the insulated substrate 1, the conductive layer 2, and the photoelectric conversion layer 3 respectively correspond to the substrate a1, the base layer b1, and the semiconductor layer T in the laminated body according to the Embodiment 1, 2, 4, or 5.

It should be noted that, in FIG. 8, an arrow A indicates the serial connection direction, and an arrow E indicates a direction of current. Hereinafter, when simply referring to an upstream side and a downstream side, these terms indicate the upstream side and the downstream side of the current direction E, respectively.

The solar cell module is provided with a plurality of integrated solar cells F (hereinafter often referred to as a string F) on a single insulated substrate 1. In a case of this embodiment, a total 16 of strings F in which the 10 thin-film photoelectric conversion devices 5 are electrically connected in series are aligned, two lines in the direction of the arrow A and eight lines in a direction of an arrow B perpendicular to the direction of the arrow A.

Further, two thin-film photoelectric conversion devices 5a and 5b extending along the direction of the arrow B are provided on an upstream side of the eight strings F aligned on the upstream side of the current direction E and a downstream side of the eight strings F aligned on the downstream side of the current direction E, and another thin-film photoelectric conversion device 5c extending along the direction of the arrow B is provided between the upstream side string F and the downstream side string F.

The eight strings F provided on the upstream side are parallelly connected to each other by the thin-film photoelectric conversion devices 5a and 5c, and the eight strings F provided on the downstream side are parallelly connected to each other by the thin-film photoelectric conversion devices 5b and 5c.

It should be noted that each pair of strings F that are adjacent in the direction of the arrow B are electrically insulated by a string separation groove 8 having no film.

Out of the thin-film photoelectric conversion devices 5a, 5b, and 5c, the thin-film photoelectric conversion devices 5a and 5c on the upstream side and in the middle position are thin-film photoelectric conversion devices (hereinafter often referred to as a cell) that actually contribute to power generation, and the thin-film photoelectric conversion device 5b on the downstream side is a thin-film photoelectric conversion device that actually does not contribute to the power generation. The cell 5b is formed to have a narrower width in the direction of the arrow A than that of the other cells 5a and 5c. Accordingly, the upstream side cell 5a belongs to the strings F on the upstream side, and the middle cell 5c belongs to the strings F on the downstream side.

Further, first, second, and third collecting electrodes 6, 7, and 14 are electrically connected by a brazing filler metal to the opposite electrode layers 4 of the respective thin-film photoelectric conversion devices 5a, 5b, and 5c. As the first to the third collecting electrodes 6, 7, and 14, such as a copper wire or a soldered copper wire is used, for example.

<String>

As shown in FIG. 8 and FIG. 9, the string F includes a device separation groove 9 provided by removing the opposite electrode layer 4 and the photoelectric conversion layer 3 between the two adjacent cells 5. The device separation groove 9 is provided extending in the direction of the arrow B so as to separate an opposite electrode 4 and the photoelectric conversion layer 3 of one of the cells 5 from the opposite electrode 4 and the photoelectric conversion layer 3 of adjacent other one of the cells 5.

In the string F, the conductive layer 2 of each cell 5 includes an extension 2a on one end (an end on the downstream side in the current direction E) that extends to a region of an adjacent other cell 5 across the device separation groove 9, and electrically insulated from the adjacent conductive layer 2 by an electrode separation line 10 for separating the electrodes.

Further, one end of the opposite electrode layer 4 of each cell 5 (an end on the upstream side in the current direction E) is electrically connected with the extension 2a of the conductive layer 2 of the adjacent cell 5 through a conductive section 4a penetrating through the photoelectric conversion layer 3. In this case, the conductive section 4a and the opposite electrode layer 4 can be monolithically formed by the same material in the same step.

Moreover, in the cells 5a and 5b respectively provided with the first and the second collecting electrodes 6 and 7, the conductive layers 2 immediately under the first and the second collecting electrodes 6 and 7 and in vicinity of this portion are electrically connected with the opposite electrode layers 4 through respective conductive sections 11a and 11b penetrating through the photoelectric conversion layers 3.

In the case of this embodiment, the conductive section 11a of the cell 5a on an most upstream side is disposed on the downstream side from the first collecting electrode 6, and the conductive section 11b of the cell 5b on a most downstream side is disposed on the upstream side from the second collecting electrode 7.

Further, in the cell 5a joined with the first collecting electrode 6 on the upstream side in the current direction E, the electrode separation line 10 is disposed on the downstream side from the first collecting electrode 6 so that a portion on the downstream side from the first collecting electrode 6 contributes to the power generation. While the cell 5a is designed to be wider in the direction of the arrow A so as to contribute to the power generation, if the electrode separation line 10 is not provided, the cell 5a does not contribute to the power generation as being short-circuited by the conductive section 11a. Accordingly, the cell 5a is provided with the electrode separation line 10 on the downstream side from the first collecting electrode 6.

It should be noted that in a case in which the cell 5a is intentionally configured not to contribute to the power generation, the cell 5a can be designed to be narrower in the direction of the arrow A and may not include the electrode separation line 10, but the cell 5a is still short-circuited by the conductive section 11a so as to prevent the current from flowing to a short-circuited portion immediately under the first collecting electrode 6.

Further, in this case, the cell 5a not contributing to the power generation is present as a region for joining the first collecting electrode 6, it is required to provide the conductive section 4a and the device separation groove 9 between the cells 5 and 5a in order to electrically connect the first collecting electrode 6 with the opposite electrode 4 of the cell 5 adjacent on the downstream side through the cell 5a.

Therefore, as shown in FIG. 9, it is preferable to design the cell 5a to have a portion that contributes to the power generation, as it is possible to directly join the first collecting electrode 6 with the opposite electrode 4 of the portion contributing to the power generation, and the conductive section 4a and the device separation groove 9 between the cells 5 and 5a are practically omitted.

Further, in the plurality of strings F, the cells 5a and 5b in which the first and the second collecting electrodes 6 and 7 are respectively formed can be continuous as shown in FIG. 8, but can be separated by the string separation grooves 8 (not depicted).

In the case shown in FIG. 8, the string separation groove 8 does not completely separate the two adjacent strings F, and the cells 5a and 5b respectively on both ends extend along the direction of the arrow B. Accordingly, both ends of all the strings F are electrically connected with the first and the second collecting electrodes 6 and 7, respectively, in parallel through the opposite electrode layers 4 that are common to the corresponding strings.

Further, in a case in which the two adjacent strings F are fully separated by the string separation groove 8, all the strings F are electrically connected with each other in parallel through the first and the second collecting electrodes 6 and 7.

It is preferable that the string separation groove 8 includes a first groove formed by removing the conductive layer 2, and a second groove formed by removing the photoelectric conversion layer 3 and the opposite electrode layer 4 such that a width of the second, groove is wider than that of the first groove, in order to prevent the short-circuit between the conductive layer 2 and the opposite electrode layer 4 of each cell due to a formation of the string separation groove 8 (not depicted).

Further, in the strings F, the cell 5b on a side of the second collecting electrode 7 does not practically contribute to the power generation as its width in a serial connection direction A is formed to be narrow. Accordingly, the opposite electrode 4 of the cell 5b is used as an extraction electrode for the conductive 2 of the adjacent cell 5.

Moreover, the plurality of strings F are formed within an outer circumferential end surface (end surfaces on four sides) of the translucent insulated substrate 1. Specifically, an outer circumferential region of the surface of the insulated substrate 1 is taken as the trimming region 12 in which the conductive layer 2, the photoelectric conversion layer 3, and the opposite electrode layer 4 are not formed, and a width of the trimming region 12 is set within a size range according to an output voltage of the solar cell.

<Layer Thickness Measurement Portion>

In the solar cell module, the layer thickness measurement portion G according to the Embodiments 1, 2, 4, or 5 as described above is provided in at least one of a photoelectric conversion region in the plurality of thin-film photoelectric conversion devices and an area outside the photoelectric conversion region in the plurality of thin-film photoelectric conversion devices.

Specifically, the conductive layer 2 of any of the plurality of thin-film photoelectric conversion devices includes the layer thickness measurement portion G having a reduced surface roughness region in a concave shape. As described above, the layer thickness measurement portion G is configured to measure the thickness of the photoelectric conversion layer 3.

According to this embodiment, the conductive layer 2 has a concave-convex surface, an RMS value of a surface roughness of this concave-convex surface is from 25 nm to 50 nm, and the layer thickness measurement portion G is provided such that an RMS value of the reduced surface roughness region of the conductive layer 2 is smaller than 23-45 nm.

FIG. 9 shows an example in which the layer thickness measurement portion G is disposed for each of a photoelectric conversion region on the downstream side of the cell 5c joined with the third collecting electrode 14 at the middle position in the serial connection direction A, a non-photoelectric conversion region immediately under the third collecting electrode 14 on the upstream side of the cell 5c, a photoelectric conversion region of the cell 5 on the upstream side of the cell 5c, a non-photoelectric conversion region immediately under the first collecting electrode 6 of the cell 5a on the most upstream side, and a non-photoelectric conversion region on the downstream side from the second collecting electrode 7 of the cell 5b on the most downstream side.

In the cells 5 and 5c in which the layer thickness measurement portion G is disposed in the photoelectric conversion region, characteristics such as an output current of the photoelectric conversion layer 3 on the reduced surface roughness region of the conductive layer 2 become more deteriorated than those of the photoelectric conversion layer 3 on the concave-convex surface of the conductive layer 2.

This is considered to be because a light confinement effect deteriorates due to the reduction of the surface roughness, or because the current cannot be collected due to the removal of the electrode layer.

A smallest one of output currents of the plurality of cells becomes an output current of the string F. Therefore, it is preferable that, in order to prevent the deterioration of the output current of the string F, an area of each of the cells 5 and 5c in which the layer thickness measurement portion G is disposed in the photoelectric conversion region is increased at least by an amount of an area of the reduced surface roughness region (plane area), specifically, the width in the serial connection direction A is increased.

It is sufficient that the layer thickness measurement portion G is formed in at least one of the photoelectric conversion region and the non-photoelectric conversion region. However, it is preferable that the layer thickness measurement portions G are formed in a central section and an outer periphery section of the insulated substrate 1, and it is more preferable that the forming portion in the outer periphery section includes four positions along the four sides of the insulated substrate 1, in order to accurately control a film thickness distribution of the photoelectric conversion layer 3. Further, the forming portion may include a section between the central section and the outer periphery section. Then, it is particularly preferable that the positions at which the layer thickness measurement portions G are to be formed are non-photoelectric conversion regions.

Further, although not shown in FIG. 9, the layer thickness measurement portion G may be formed in at least one of a position at which the trimming region 12 is to be formed and a position at which the string separation groove 8 is to be formed, from both of which the conductive layer 2 is ultimately removed.

The position at which the trimming region 12 is to be formed is advantageous for forming the layer thickness measurement portion G on the outer periphery section, and the position at which the string separation groove 8 is to be provided is advantageous for forming the layer thickness measurement portion G on the section between central section and the outer periphery section and near the central section. Further, the layer thickness measurement portion G may be disposed at a position at which the device separation groove 9 is to be formed (non-photoelectric conversion region), where the conductive layer 2 remains but the photoelectric conversion layer 3 is ultimately removed.

While examples of the alignment place of the layer thickness measurement portion G described above are shown by dots in FIG. 8, it should be appreciated that the portions and a number of the alignment are not limited to these examples.

<Method for Manufacturing Solar Cell Module>

The solar cell module can be manufactured by a method for manufacturing including: a step of forming the photoelectric conversion layer (semiconductor layer) 3 and the opposite electrode layer 4 in the stated order on the conductive layer 2 having the concave-convex surface on the insulated substrate 1; a step of forming the device separation groove 9 by removing a part of the opposite electrode layer 4 and the photoelectric conversion layer 3 such that the plurality of cells (thin-film photoelectric conversion devices) are configured to be electrically connected in series; a step of forming the trimming region 12 by removing the conductive layer 2, the photoelectric conversion layer 3, and the opposite electrode layer 4 laminated on the outer periphery section of the insulated substrate 1; and a step of forming the string separation groove 8 by removing a part of the conductive layer 2, the photoelectric conversion layer 3, and the opposite electrode layer 4 such that the plurality of cells 5, 5a, 5b, and 5c are formed. The method for manufacturing further includes forming the layer thickness measurement portion G is formed in any region in the conductive layer 3 before forming the photoelectric conversion layer 3 on the conductive layer 2.

Here, it is preferable that the any region is the position described above at which the film thickness distribution of the photoelectric conversion layer 3 can be accurately controlled.

Next, a specific description is given taking an example where a solar cell module having the layer thickness measurement portion G at the position described with reference to FIG. 8 and FIG. 9 is manufactured.

[Formation of Conductive Layer]

Figure 10A:
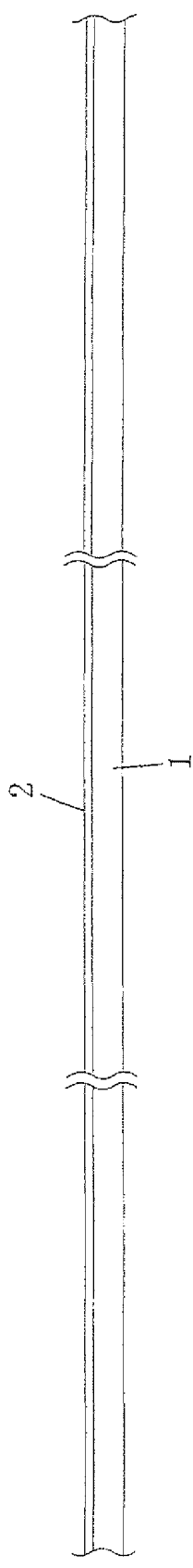
FIGS. 10(A)-10(C) show process flow diagrams of manufacturing the integrated thin-film solar cell module of the Embodiment 7.

In a film formation step, as shown in. FIG. 10(A), first, the translucent conductive layer 2 having a film thickness of 600-1000 nm is formed over an entire surface of the translucent insulated substrate 1 using a method such as CVD, sputtering, or evaporation.

At this time, the conductive layer 2 is formed such that the RMS value of the surface roughness is from 20 nm to 100 nm.

Figure 10B:
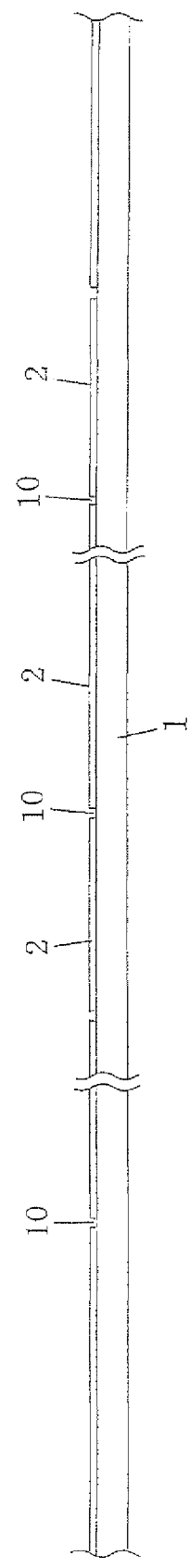

Next, as shown in FIG. 10(B), the conductive layer 2 is formed into a predetermined pattern by partially removing the conductive layer 2 by an optical beam to form the electrode separation line 10. At this time, by illuminating the fundamental wave (wavelength: 1064 nm) of the YAG laser from a side of the translucent insulated substrate 1, the translucent conductive layer 2 is divided at a predetermined width into strips, and the electrode separation lines 10 are formed at a predetermined interval.

[Formation of Reduced Surface Roughness Region]

Figure 10C:
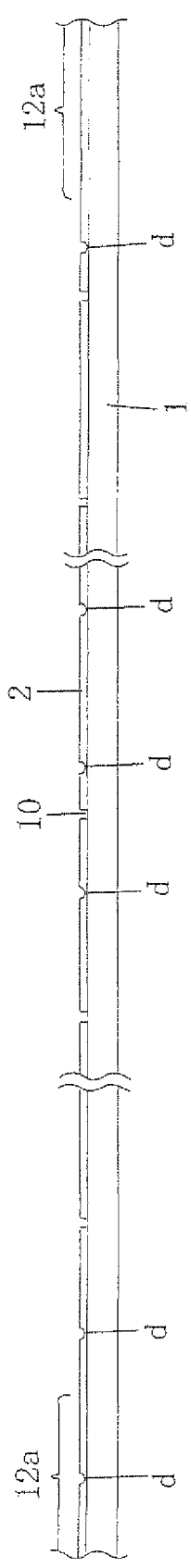

Next, as shown in FIG. 10(C), a reduced surface roughness region d in a concave shape is formed at a predetermined position of the conductive layer 2. The reduced surface roughness region d can be formed in the conductive layer 2 using the Galvano scanning laser described according to the Embodiments 1 and 2, and at this time, the reduced surface roughness region d in a circle in which the RMS value of the surface roughness is smaller than 23-45 nm, a diameter is on the order of 1-5 mm, a depth is on the order of 100-1000 nm, for example, is formed. It should be noted that, in FIG. 10(C), a reference symbol 12a represents a region in which a trimming region is to be formed.

[Formation of Photoelectric Conversion Layer]

Figure 11A:
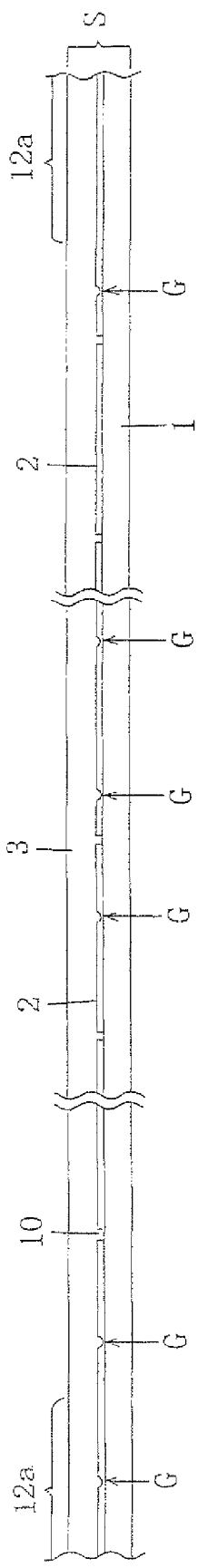
FIGS. 11(A)-11(C) show process flow diagrams continues from FIG. 10(C)

Subsequently, the obtained substrate is subjected to ultrasonic cleaning by pure water, and then, as shown in FIG. 11(A), the photoelectric conversion layer 3 is formed on the conductive layer 2 by the plasma CVD such that the electrode separation line 10 is completely filled in. For example, an upper semiconductor layer is formed by laminating the a-Si:H p-layer, the a-Si:H i-layer (film thickness of on the order from 150 nm to 300 nm), and the a-Si:H n-layer in the stated order on the first electrode 2, and a lower semiconductor layer is formed by laminating the μc-Si:H p-layer, the μc-Si:H i-layer (film thickness of on the order from 1.5 μm to 3 μm), and the μc-Si:H n-layer in the stated order on the upper semiconductor layer.

In this step, the layer thickness measurement portions G are formed by forming the photoelectric conversion layer 3 on the reduced surface roughness regions d in the conductive layer 2.

It should be noted that, while not shown in FIGS. 11(A) to 11(C), the shape of the reduced surface roughness region d and the shape of the surface concavity and convexity in the conductive layer 2 are reflected on the surface of the photoelectric conversion layer 3, as described with reference to FIG. 1, for example.

[Layer Thickness Measurement of Photoelectric Conversion Layer]

After manufacturing a laminated body S shown in FIG. 11(A) by forming the photoelectric conversion layer 3 on the conductive layer 2, the film thickness t of the photoelectric conversion layer 3 at the layer thickness measurement portion G is measured using the ellipsometry, as described in the Embodiments 1 and 2 (FIG. 1 and FIG. 2).

At this time, as described above, at the layer thickness measurement portion G, the film thickness t of the photoelectric conversion layer 3 can be measured with a high degree of accuracy. In addition, by measuring the film thickness t of the photoelectric conversion layer 3 of each layer thickness measurement portion G disposed in the central section and the outer periphery section of the insulated substrate 1, it is possible to control the film thickness distribution of the photoelectric conversion layer 3 with a high degree of accuracy.

Figure 11B:
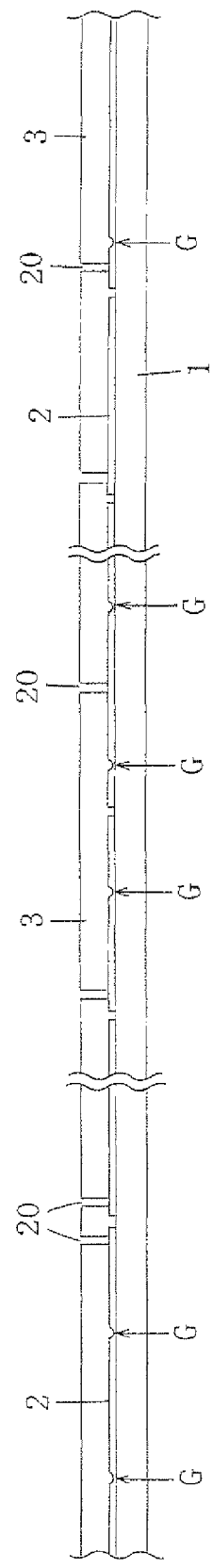

Subsequently, as shown in FIG. 11(B), the photoelectric conversion layer 3 is formed into a predetermined pattern by partially removing the photoelectric conversion layer 3 by the optical beam to form contacting lines for forming the conductive sections 4a, 11a, and 11b (see FIG. 9 and FIG. 11(C)).

At this time, by illuminating the second harmonic (wavelength: 532 nm) of the YAG laser from a side of the translucent insulated substrate 1, the photoelectric conversion layer 3 is divided at a predetermined width into strips. It should be noted that the second harmonic (wavelength: 532 nm) of the YVO$_4$ laser can be used as the laser, instead of the second harmonic of the YAG laser.

[Formation of Opposite Electrode Layer]

Figure 11C:
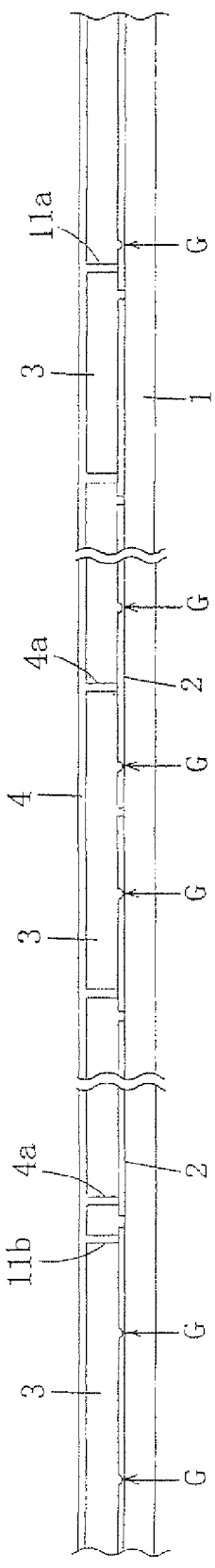

Next, as shown in FIG. 11(C), the opposite electrode layer 4 is formed on the photoelectric conversion layer 3 by a method such as CVD, sputtering or evaporation, such that the contacting lines are completely filled in.

In this step, the conductive film can be configured as a two-layered structure including a transparent conductive layer (such as ZnO, ITO, or $SnO_2$) and a metallic film (such as Ag or Al). A film thickness of the transparent conductive layer can be 10-200 nm, and a film thickness of the metallic film can be 100-500 nm.

Figure 12A:
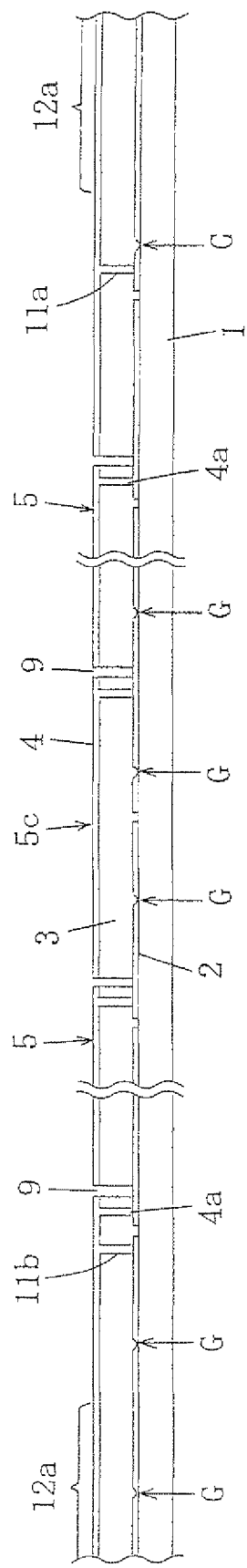
FIGS. 12(A) and 12(B) show process flow diagrams that continue from FIG. 11(C)
Figure 12B:
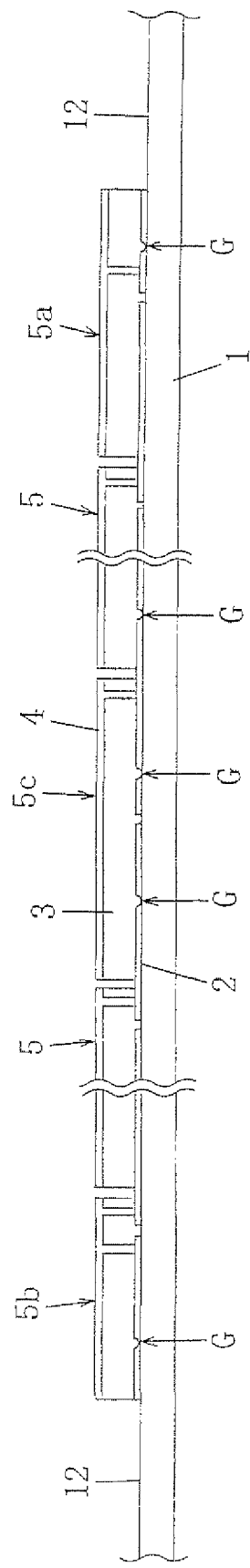

Subsequently, as shown in FIG. 12 (A), by partially removing the opposite electrode layer 4 and the photoelectric conversion layer 3 with the optical beam to form the device separation grooves 9, the pre-divided string f (the integrated thin-film solar cell that will be described in an Embodiment 8 later) in which the plurality of cells 5 are connected in series through the conductive section 4a is formed on the insulated substrate 1 (see FIG. 13).

It should be noted that, when manufacturing the solar cell module shown in FIG. 8 and FIG. 9, the width of the cell 5c on the middle in the direction of the arrow A that is joined with the third collecting electrode 14 is set to be wide, and the width of the cell having the reduced surface roughness region d in the photoelectric conversion region is considered in the same manner.

Further, in the patterning of the opposite electrode layer 4, the second harmonic of the YAG laser or the second harmonic of the $YVO_4$ laser that is highly transmissive to the conductive layer 2 is illuminated from the side of the translucent insulated substrate 1 so as to prevent the translucent conductive layer 2 from being damaged by the optical beam. With this, the photoelectric conversion layer 3 and the opposite electrode layer 4 are separated into strips of a predetermined width, and the device separation grooves 9 are formed. At this time, it is preferable to minimize the damage to the conductive layer 2, and to select processing conditions that allow restriction of an occurrence of burr in the metallic film after processing the opposite electrode layer 4.

[Film Removal Step]

After the film formation step described above, as shown in FIG. 12 (B), the conductive layer 2, the photoelectric conversion layer 3, and the opposite electrode layer 4, which are cell portions formed in the outer periphery section of the surface of the translucent insulated substrate 1 (the region 12a in which the trimming region is to be formed), are removed using the fundamental wave of the YAG laser, at a predetermined width toward from the outer circumferential end surface to inside of the translucent insulated substrate 1, to form the trimming region 12 along an entire circumference. With this, the layer thickness measurement portion G provided in the region 12a in which the trimming region is to be formed is also removed.

Further, before or after this step, the plurality of string separation grooves 8 are formed by removing the separation parts in order to separate the pre-divided string f into plural strings. With this, the layer thickness measurement portion G provided in the region in which the string separation groove is to be formed is also removed.

At this time, first, by illuminating the fundamental wave (wavelength: 1064 nm) of the YAG laser from the side of the translucent insulated substrate 1, the conductive layer 2, the photoelectric conversion layer 3, and the opposite electrode layer 4 are partially removed to form the first grooves. Subsequently, the second harmonic of the YAG laser or the second harmonic of the $YVO_4$ laser that is highly transmissive to the conductive layer 2 is illuminated from the side of the translucent insulated substrate 1. With this, the photoelectric conversion layer 3 and the opposite electrode layer 4 are partially removed to form the second grooves such that the width of the second grooves is wider than that of the first grooves. With this, it is possible to form the string separation grooves 8.

By forming the second grooves whose width is wider than that of the first grooves afterwards, it is possible to remove electrical conducting material that have flown apart and attached with a inside surface of the grooves when forming the first grooves, and whereby it is possible to avoid a short-circuit between the conductive layer 2 and the opposite electrode layer 4.

In the film removal step, the strings F of multiple row surrounded by the trimming region 12 are formed. It should be noted that, when the pre-divided string is not separated, only laser processing for forming the trimming region 12 is carried out in the film removal step.

[Formation of Collecting Electrode]

As shown in FIG. 9, by applying a brazing filler metal (silver paste, for example) on the opposite electrode layer 4 of the cells 5a and 5b on both ends and the cell 5c in the middle of each string S in the serial connection direction A, and pressure joining and heating the first, the second, and the third collecting electrodes 6, 7, and 14, the first, the second, and the third collecting electrodes 6, 7, and 14 are electrically connected with the opposite electrode layer 4 to produce a current take-out section.

At this time, while a pressing force is, for example, on the order of 60 N, and a thermal energy is, for example, on the order of 300 degrees Celsius, as the cells 5a, 5b, and 5c are thin, there is a case in which a short-circuited portion is formed immediately under the first, the second, and the third collecting electrodes 6, 7, and 14.

The current flowing through the short-circuited portion may possibly produce heat. However, as shown in FIG. 9, in the cell 5a joined with the first collecting electrode 6, the portion immediately under the first collecting electrode 6 does not contribute to the power generation, as the opposite electrode layer 4 and the conductive layer 2 are short-circuited at this position and the electrode separation line 10 is formed on the downstream side of the conductive section 11a, and the current flows through the portion on the downstream side from the electrode separation line 10 constituting the power generation region, and whereby a local heat generation is prevented before occurring.

Further, as the cell 5b joined with the second collecting electrode 7 is insulated and separated from the conductive layer 2 of the cell 5 on the upstream side by the electrode separation line 10, and the conductive layer 2 and the opposite electrode layer 4 are previously short-circuited by the conductive section 11b, the current does not flow through the short-circuited portion, and whereby the local heat generation is prevented before occurring.

Moreover, even if the current flows from the conductive layer 2 of the cell 5 on the upstream side to the opposite electrode layer 4 of the cell 5c joined with the third collecting electrode 14 through the conductive section 4a, a major part of the current is taken out through the third collecting electrode 14, and a part of the current flows to the conductive layer 2 on the downstream side from the electrode separation line 10 through the photoelectric conversion layer 3. Therefore, in the cell 5c, even if there is a short-circuited portion in the photoelectric conversion layer 3 immediately under the third collecting electrode 14, local heat generation due to the current flowing to the short-circuited portion hardly occurs. Further, even if a current is generated in the photoelectric conversion layer 3 immediately under the third collecting electrode 14, there is no possibility that this current flows to the short-circuited portion to produce heat.

[Other Steps]

Next, a transparent EVA sheet as a material for an adhesive layer and a back-side sealing material are layered on a back side of the solar cell (a side of non-light receiving surface), and the back-side sealing material is closely attached to the solar cell with the adhesive layer interposed therebetween using a vacuum laminating device. At this time, it is preferable to use a PET/Al/PET lamination film as the back-side sealing material.

Subsequently, a take-out line that is not illustrated is electrically connected with an output line of a terminal box, the terminal box is adhered to the back-side sealing material, and the terminal box is filled with a silicone resin. Then, a metal frame (aluminum frame, for example) is attached to the outer periphery section of the thin-film solar cell, and whereby a product is completed.

(Embodiment 8)

Figure 13:
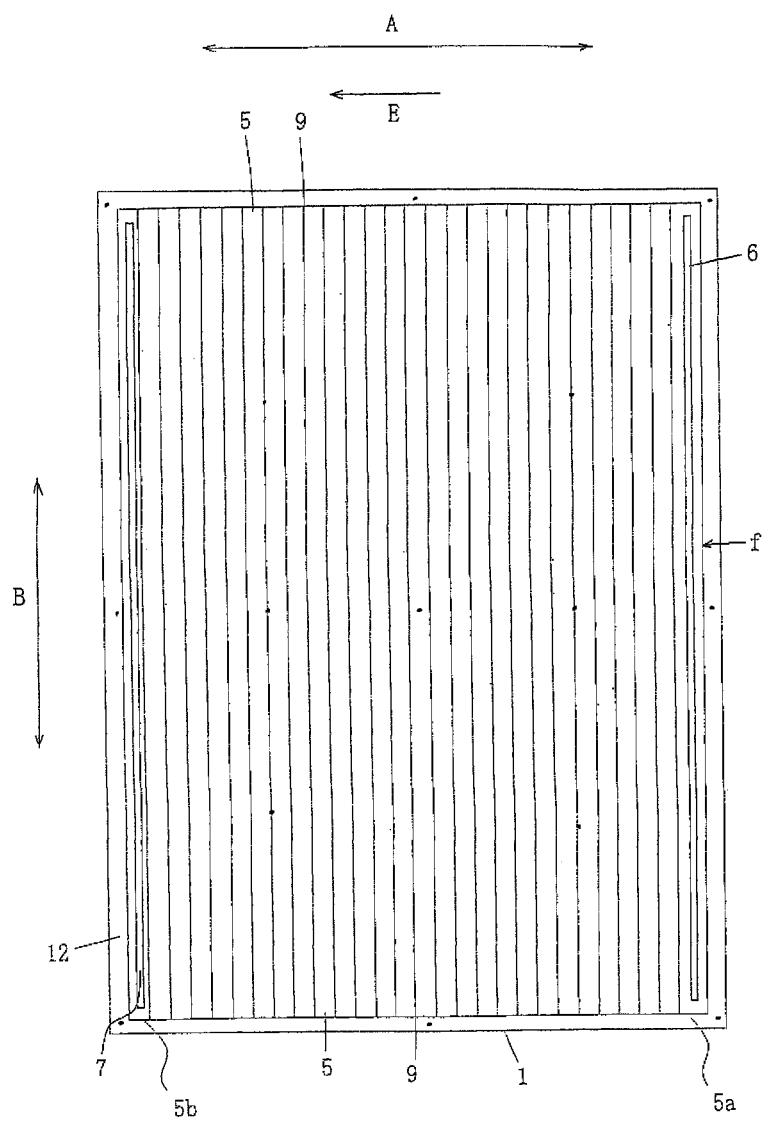
FIG. 13 shows a plan view illustrating an integrated thin-film solar cell (an Embodiment 8) according to the present invention.

FIG. 13 shows a plan view illustrating the Embodiment 8 (integrated thin-film solar cell) according to the present invention. The Embodiment 8 is an integrated thin-film solar cell in which a plurality of thin-film photoelectric conversion devices each configured such that the opposite electrode is formed on the semiconductor layer on the laminated body according to the Embodiments 1 and 2 are electrically connected in series.

This integrated thin-film solar cell can be manufactured according to the method for manufacturing of the Embodiment 7, other than that the string separation grooves 8 as described with reference to FIG. 12 (B) of the Embodiment 7 above are not formed, and the first and the second collecting electrodes 6 and 7 are joined only with the cells 5a and 5b on the most upstream and the most downstream. However, in a case of the integrated thin-film solar cell according to the Embodiment 8, the widths of the plurality of cells 5 between the cells 5a and 5b on the most upstream and the most downstream in the direction of the arrow A are substantially identical.

Further, in the case of the integrated thin-film solar cell according to the Embodiment 8, the alignment places of the layer thickness measurement portion G are eight portions in the central section and the outer periphery section and six portions around the central section, for example, as shown by dots in FIG. 13. The six portions around the central section can be positions at which the device separation grooves 9 are to be formed (non-photoelectric conversion regions).

INDUSTRIAL APPLICABILITY

The laminated body according to the present invention is applicable to a laminated body having a semiconductor layer whose film thickness is controlled with a high degree of accuracy, and particularly advantageous to a thin-film photoelectric conversion device and an integrated thin-film solar cell.

DESCRIPTION OF THE REFERENCE NUMERALS

1: Insulated substrate
2: Conductive layer
4: Opposite electrode layer
5: Thin-film photoelectric conversion device (Cell)
8: String separation groove
9: Device separation groove
12: Trimming region
c1, c3: Concave-convex surface
B1, B2, B3: Supporting body
d, d1, d2, d3: Reduced surface roughness region
G, G1, G2, G3, G4, G5, G6: Layer thickness measurement portion
S, S1, S2, S3, S4, S5, S6: Laminated body
T, 3: Semiconductor layer (Photoelectric conversion layer)
t: Layer thickness (Film thickness)

The invention claimed is:

1. A laminated body comprising
   a supporting body comprising a conductive layer formed on a substrate and the conductive layer has a concave-convex surface and
   a semiconductor layer laminated on a surface of the supporting body, wherein
   a part of the supporting body includes a layer thickness measurement portion for optically measuring a layer thickness of the semiconductor layer, and
   the layer thickness measurement portion includes a reduced surface roughness region whose surface roughness is smaller than that of the concave-convex surface, and
   the reduced surface roughness region is formed on a part of a surface of the conductive layer in contact with the semiconductor layer and at a portion at which the conductive layer is not present.

2. The laminated body according to claim 1, wherein
   a ratio between an RMS value of the reduced surface roughness region and an RMS value of the concave-convex surface is not greater than 0.9.

3. The laminated body according to claim 1, wherein
   an RMS value of the reduced surface roughness region is smaller than 23 nm.

4. The laminated body according to any claim 1, wherein
   the layer thickness measurement portion includes a through hole whose diameter is 10-200 μm in the semiconductor layer laminated on the reduced surface roughness region.

5. The laminated body according to claim 1, wherein
   the layer thickness measurement portion includes the reduced surface roughness region whose size falls within an area of 1-5 mm$^2$.

6. The laminated body according to claim 1, wherein
   the reduced surface roughness region is in a concave shape.

7. The laminated body according to claim 6, wherein
   the concave shape of the reduced surface roughness region is a shape such that an angle θ of a tangent line $P_1$ tangent to a concave curve surface is not smaller than 45 degrees with respect to a normal line P presupposing the supporting body B1 is a flat surface.

8. The laminated body according to claim 1, wherein
   a planar shape of the reduced surface roughness region is a closed figure.

9. A thin-film photoelectric conversion device comprising
   the laminated body according to claim 1 and
   an opposite electrode layer formed on the semiconductor layer of the laminated body.

10. An integrated thin-film solar cell comprising a plurality of thin-film photoelectric conversion devices according to claim 9 that are electrically connected with each other in series.

11. The integrated thin-film solar cell according to claim 10, wherein
    the layer thickness measurement portion is disposed outside a photoelectric conversion region of the plurality of thin-film photoelectric conversion devices.

12. A thin-film solar cell module comprising a plurality of integrated thin-film solar cells according to claim 10 that are formed on the substrate.

\* \* \* \* \*